United States Patent
Kim

(10) Patent No.: US 10,181,456 B2
(45) Date of Patent: Jan. 15, 2019

(54) MULTI-PACKAGE INTEGRATED CIRCUIT ASSEMBLY WITH PACKAGE ON PACKAGE INTERCONNECTS

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/461,052

(22) Filed: Mar. 16, 2017

(65) Prior Publication Data
US 2018/0269183 A1 Sep. 20, 2018

(51) Int. Cl.
| | |
|---|---|
| H01L 23/48 | (2006.01) |
| H01L 25/065 | (2006.01) |
| H01L 23/00 | (2006.01) |
| H01L 23/08 | (2006.01) |
| H01L 25/00 | (2006.01) |
| H01L 21/56 | (2006.01) |

(52) U.S. Cl.
CPC .......... *H01L 25/0657* (2013.01); *H01L 21/56* (2013.01); *H01L 23/08* (2013.01); *H01L 24/16* (2013.01); *H01L 24/17* (2013.01); *H01L 24/81* (2013.01); *H01L 25/50* (2013.01); *H01L 2224/16057* (2013.01); *H01L 2224/16104* (2013.01); *H01L 2225/06513* (2013.01); *H01L 2225/06544* (2013.01)

(58) Field of Classification Search
CPC ................. H01L 25/0657; H01L 23/08; H01L 2224/16057; H01L 2224/16104
USPC .......................... 257/686, 723, 738, E25.023
See application file for complete search history.

(56) References Cited

U.S. PATENT DOCUMENTS

| | | | |
|---|---|---|---|
| 7,989,959 B1 * | 8/2011 | Rahman ................ | H01L 23/481 257/686 |
| 2009/0294941 A1 * | 12/2009 | Oh ........................ | H01L 23/367 257/686 |

(Continued)

FOREIGN PATENT DOCUMENTS

JP 09027676 A * 1/1997 ............... H05K 3/34

OTHER PUBLICATIONS

Office action Appendix—Machine translation from J-PLAT online of Yoshimura, Toshikihiko (JP 09-027676A).*

*Primary Examiner* — Brook Kebede
(74) *Attorney, Agent, or Firm* — Schwegman Lundberg & Woessner, P.A.

(57) ABSTRACT

A multi-package integrated circuit assembly can include a first electronic package having a first package substrate including a first die side and a first interface side. A first die can be electrically coupled to the first die side. A second electronic package can include a second package substrate having a second die side and a second interface side. A second die can be electrically coupled to the second die side. A conductive interconnect can be electrically coupled from the interface side of the first package substrate to the interface side of the second package substrate. A collective substrate can be attached to the first electronic package. For instance, the collective substrate can be located on a face of the first electronic package opposing the first package substrate. The collective substrate is electrically coupled to the first die and the second die through the first package substrate.

14 Claims, 6 Drawing Sheets

(56) References Cited

U.S. PATENT DOCUMENTS

| | | | | |
|---|---|---|---|---|
| 2014/0127860 A1* | 5/2014 | Muto | ............... | H01L 23/04 |
| | | | | 438/109 |
| 2015/0108663 A1* | 4/2015 | Hong | ............ | H01L 25/0657 |
| | | | | 257/777 |
| 2015/0235989 A1* | 8/2015 | Yu | ............ | H01L 25/50 |
| | | | | 257/712 |

* cited by examiner

MULTI-PACKAGE INTEGRATED CIRCUIT ASSEMBLY WITH PACKAGE ON PACKAGE INTERCONNECTS

TECHNICAL FIELD

This document pertains generally, but not by way of limitation, to integrated circuit assemblies, such as integrated circuit assemblies including multiple electronic packages.

BACKGROUND

Integrated circuit assemblies, such as integrated circuit assemblies including two or more electronic packages, can be used for logic processing or memory storage. Electronic packages can include one or more dies, such as silicon dies. For instance, integrated circuit assemblies can be used in personal computers, servers, game counsels, internet-of-things devices, and other electronic devices. Datacenter and server markets seek integrated circuit assemblies with higher performance and compact size. With increasing computing demand, integrated circuit assemblies often include multiple dies. For instance, integrated circuit assemblies can include several electronic packages communicatively coupled together. Often, the electronic packages can be stacked to reduce the amount of board space used to couple the integrated circuit assembly to a printed circuit board or substrate of the circuit package. In a further example, a plurality of dies can be stacked on one another within the integrated circuit assembly to provide more processing and memory capacity.

Electrical connections between stacked electronic packages are often located alongside the lower die, for instance, around the perimeter of the lower die. The electrical pads of the upper electronic package and lower electronic package can be specially configured for the stacked arrangement. For instance, the contacts of the upper electronic package may be arranged in an area corresponding to locations around the exterior perimeter of the upper die. Accordingly, a substrate of the upper or lower electronic package can include dimensions larger enough to accommodate the die foot print and the electrical connections. In some instances, the cost of defects in the manufactured electronic package can increase as the number of dies or electronic packages increase. For example, warpage between dies or electronic packages can result in difficulties in forming electrical connections between the various dies and electronic packages. There is a general need for devices, systems and methods to address the requirements for integrated circuit assemblies with increased performance and small size, while at the same time reducing yield losses.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
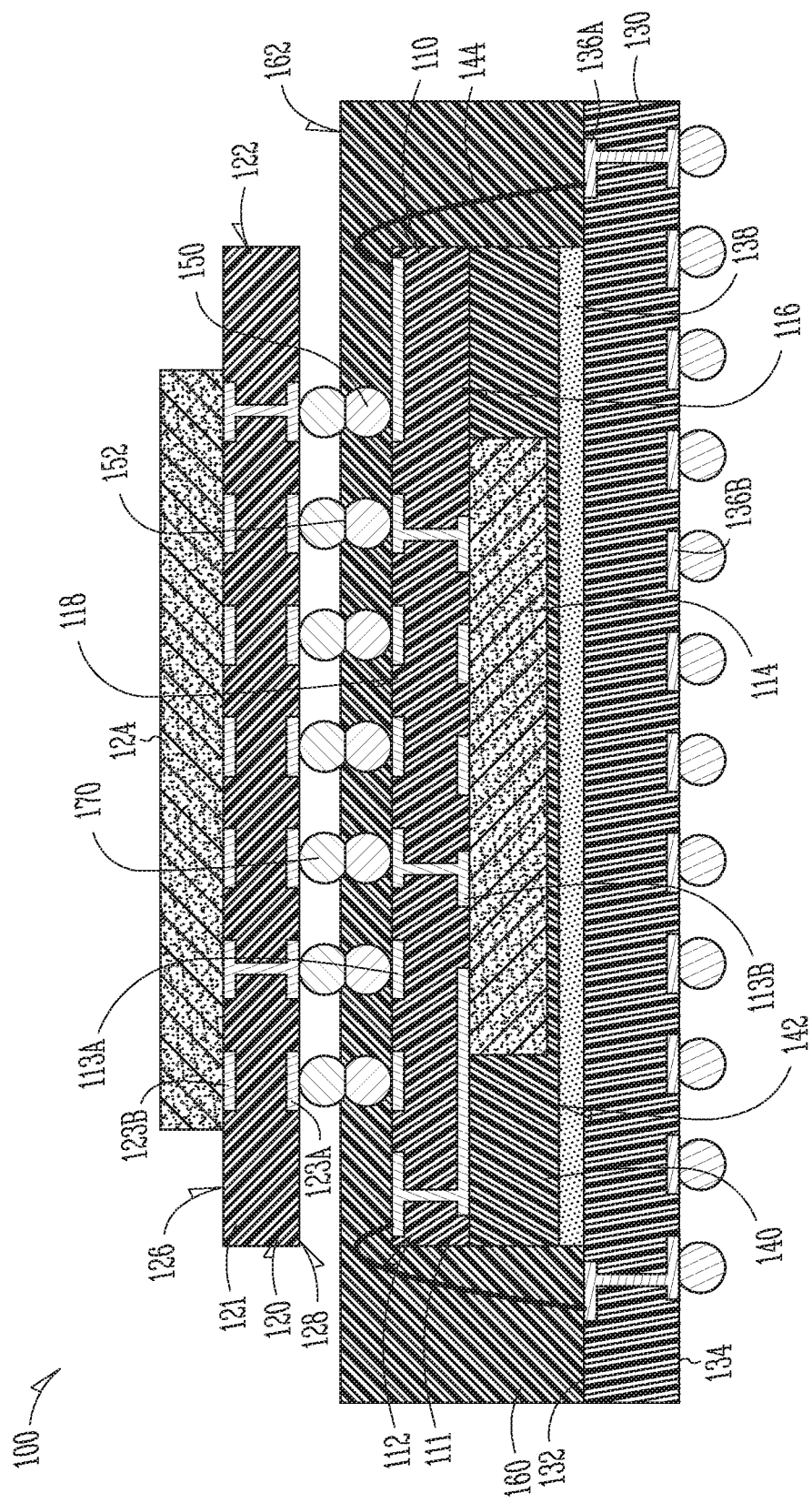
FIG. 1 illustrates an example of a multi-package integrated circuit assembly, according to an embodiment.

The present application relates to devices and techniques for a multi-package integrated circuit assembly, such as a multi-package integrated circuit assembly including a first electronic package electrically coupled to a second electronic package by a conductive interconnect. The conductive interconnect can be located between a first substrate of the first electronic package and a second substrate of the second electronic package, where the first and second substrates are located between a first die of the first electronic package and a second die of the second electronic package. The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized, among other things, that a problem to be solved can include increasing the number of dies within an integrated circuit assembly while reducing size and mitigating manufacturing defects. Integrated circuit assemblies often include a plurality of dies within a single electronic package. For instance, an electronic package can include a plurality of stacked silicon dies (e.g., a three-dimensional electronic package). As the number of dies stacked together increases, yield loss of electronic packages can increase accordingly. Often, the electronic package cannot be fully tested until all dies are assembled. One manufacturing defect or one bad die can cause a whole electronic package to be scrapped, including good dies within the electronic package. Where the electronic package includes a plurality of dies, the cost of yield loss can be greater than single die electronic packages. For multi-die electronic packages, for instance, electronic packages exceeding sixteen dies, the yield losses can be prohibitive.

The yield loss can be reduced by electrically coupling two electronic packages into a single integrated circuit assembly (e.g., package on package (PoP) module). This can decrease the number of dies within each electronic package, and accordingly decrease the yield loss due to a defect in one of the electronic packages. For instance, a thirty-two die integrated circuit assembly can be constructed of two sixteen die electronic packages. The electronic packages of the (PoP) integrated circuit assembly can be electrically coupled by one or more through-mold vias (TMVs) located around the periphery of a first electronic package. The TMVs can be electrically coupled to an underside of a substrate of a second electronic package. In an example, the TMV can be formed by laser drilling an aperture through the overmold of the first electronic package to expose a conductive pad on a substrate of the first electronic package. Due to process limitations, such as a plasma effect, focus of the laser beam, recasting of the drilled material, barreling of the drilled material, or other processing parameters or processing effects, the laser drilled aperture often includes a taper. Accordingly, a diameter of the TMV can increase as a length of the TMV increases corresponding to the taper of the TMV. For instance, thicker electronic packages can include TMVs with increased diameters (or widths).

To couple an upper electronic package to a lower electronic package, a pinout (e.g., ball grid array) of the upper electronic package can be aligned with the TMVs from the lower electronic package. As previously stated, the TMVs are often located around the periphery of the die of the lower electronic package. In other words, the signal contacts of the second electronic package are not located in the center portion of the second electronic package. Accordingly, the size of the lower electronic package can be increased due to the TMV locations around the periphery of the die. Accordingly, the upper or lower electronic packages may be less desirable to sell as independent electronic packages because of the non-standard arrangement of the signal contacts (e.g., being located around the periphery of the die) and larger size. In addition, where electronic package size is limited, the number of die to die interconnections may be reduced because of limited space for TMVs around the periphery of the electronic package.

Furthermore, having TMVs around the periphery of the die can increase the positional tolerance of the TMV connections between the first electronic package and the second electronic package due to increased flatness tolerance (e.g., warpage). For instance, the position of the TMV can deviate further from the designed location as the TMV is located further from the center of the electronic package, as a result of the increased positional tolerance. If the TMVs are too far out of alignment, electrically coupling the first and second electronic packages may be difficult.

Electronic packages including stacked silicon dies can have an increased thickness over single die electronic packages. For instance, the thickness of the electronic package can increase with each additional die. As previously discussed, the TMV can increase in size (e.g., diameter or width) as the length of the TMV increases corresponding to the thickness of the electronic package due to the TMV taper. Larger TMVs can result in larger dimensions for the electronic package or PoP module as previously discussed. Furthermore, electronic packages with sixteen or more dies may include a thickness greater than 1 mm. Forming a TMV through an electronic package with a thickness of 1 mm or greater can be problematic from a manufacturing standpoint.

The present subject matter can provide a solution to this problem, such as by electrically coupling a conductive interconnect located from an interface side of a first package substrate to an interface side of a second package substrate. For instance, the first package substrate can include a first die side and the first interface side. At least one die (e.g., a first die) can be electrically coupled to the first die side of the first package substrate. The second electronic package can include the second package substrate. The second package substrate can include a second die side and the second interface side. At least one second die can be electrically coupled to the second die side of the second package substrate. In other words, the first substrate and the second substrate can be located between the first die and the second die.

The conductive interconnect can electrically couple the first package substrate and the second package substrate. For instance, the conductive interconnect can be located from the interface side of the first package substrate to the interface side of the second package substrate. As the first die and the second die are not located between the first substrate and the second substrate, the size of the multi-package integrated circuit assembly can be reduced because conductive interconnect can be in any part of the substrate. In various examples, the conductive interconnect can be located in the center portion of the first or second substrates, between the first and second dies, within a portion of the first or second substrates corresponding to the periphery of the first or second dies, or the like. Accordingly, the positional tolerance of the conductive interconnect can be improved by locating the conductive interconnect closer to the center of the electronic package, where the positional tolerances can be smaller as previously discussed. In some examples, the length of the conductive interconnect can be shortened by locating the conductive interconnect between the dies. For instance, the distance between the first interface side and the second interface side can be smaller than the distance between substrates of many PoP modules. Because of the shorter conductive interconnects, faster signal communication is possible between the first electronic package and the second electronic package. In a further example, the number of conductive interconnects can be increased because conductive interconnects can be located in the center portion of the electronic package, such as between the first die and the second die. Electrically coupling the first electronic package to a second electronic package can reduce the cost of yield loss by reducing the number of dies (e.g., stacked dies) in each electronic package while having the same number of total dies in the multi-package integrated circuit assembly.

A collective substrate can be attached to the first electronic package. In an example, the collective substrate can be located on a face of the first electronic package opposing the first package substrate. The collective substrate can be electrically coupled to the first die and the second die through the first package substrate. The collective substrate can be electrically coupled to an electronic device. Accordingly, the first electronic package and the second electronic package can be communicatively coupled to the electronic device through the collective substrate.

The second electronic package can include a contact arrangement that is substantially similar to the contact arrangement of the first electronic package. For instance, both the top and bottom electronic packages can include a standard contact arrangement. The first electronic package or the second electronic package can be sold separately or used individually in other electronic devices. In other words, the first electronic package or the second electronic package need not be specific to the multi-package integrated circuit assembly.

FIG. 1 illustrates an example of a multi-package integrated circuit assembly 100, according to an embodiment. The integrated circuit assembly 100 can include two or more electronic packages, such as a first electronic package 110 and a second electronic package 120. The first electronic package 110 can be communicatively coupled (e.g., electrically coupled) to the second electronic package 120. For instance, the first electronic package 110 can be communicatively coupled to the second electronic package 120 by a conductive interconnect 150. The electronic package can include a package substrate and a die. For instance, the first electronic package 110 can include a first package substrate 112 and a first die 114. The second electronic package 120 can include a second package substrate 122 and a second die 124. At least one die can be electrically coupled to the respective substrate. For instance, the first die 114 can be electrically coupled to the first substrate 112, and the second die 124 can be electrically coupled to the second substrate 122. In an example, the die can be electrically coupled to one or more contacts or routing layers of the substrate. In various examples, the electronic package can be a single-die package or a multi-die package. As shown in the example of FIG. 1, the first electronic package 110 and the second electronic package 120 are single-die packages.

A collective substrate 130 can be attached to one or electronic packages of the integrated circuit assembly 100. In the example, of FIG. 1, the collective substrate 130 is attached to the first electronic package 110. For instance, the first electronic package 110 can include an insulative covering 140. The collective substrate 130 can be attached to a face 142 of the insulative covering 140. In some examples, the collective substrate 130 can be directly attached to a die of the first electronic package 110, such as die 114. The second electronic package 120 is shown without an insulative covering in the example of FIG. 1. It is to be understood that reference to the substrate, electronic package, die, contact, insulative covering, or the like may be referred to generally or to a specific instance shown in one or more of the FIGS. herein, however, such description can apply to various examples of this disclosure.

The die, such as die 114 or 124, can include a semiconductive material, such as monocrystalline silicon, gallium arsenide, or the like. In various examples, the die can be configured as a processor (e.g., graphics processing unit (GPU) or central processing unit (CPU)), memory package (e.g., random access memory (RAM), flash memory, read only memory (ROM), or other logic or memory package. The die can include at least one electrical contact (die interconnect). For instance, the die interconnect can include, but is not limited to a solder pad, ball grid array (BGA), land grid array (LGA), wire-bond pad, chip carrier contact, or other electrical contact for electrically coupling the die to the substrate, such as substrate 112 or substrate 122 respectively.

The substrate, such as substrate 112 or 122, can provide mechanical support to the die, such as die 114 or die 124, and the substrate can provide one or more electrical routing layers for electrical communication between the die and the electronic device. As shown in FIG. 1, the substrate can include a die side and an interface side. For instance, the first electronic package 110 can include the first package substrate 112 having a first die side 116 and a first interface side 118. The first die 114 can be electrically coupled to the first die side 116 of the first package substrate 112. The second electronic package 120 can include the second package substrate 122 having a second die side 126 and a second interface side 128. The second die 124 can be electrically coupled to the second die side 126 of the second package substrate 122.

The substrate can include one or more conductive materials attached to a dielectric material, such as dielectric material 111 or dielectric material 121. For instance, in the example of FIG. 1, the substrate can include a conductive layer laminated on a dielectric layer. The dielectric material can include at least one dielectric layer fabricated from materials including, but not limited to, FR-4, prepreg, ceramic, epoxy, other glass or fiber filled resin, polyimide, polyester, polyether ether ketone (PEEK), or the like. Accordingly, the substrate can provide mechanical support for the die, electrical connections and routing for the die, or both. In an example, for mechanical support, the substrate can include a core including, but not limited to, a ceramic core.

In an example, the conductive layer can be laminated on two sides of the dielectric layer, such as two opposing sides of the dielectric layer. In a further example, the substrate can include a single sided, double sided, or multi-layer construction (e.g., multiple layers of alternating dielectric and conductive materials). In some examples, the substrate can include a Copper Clad Laminate (CCL). The CCL can include the conductive material (e.g., metallic foil) that can be attached to (e.g., laminated on) one or more dielectric layers of the substrate. In other examples, the conductive material can be printed on to the substrate, for instance with an inkjet printer. In an example, the conductive material can be electrodeposited (electroplated) onto the substrate. The conductive material can be formed into one or more electronic circuits (e.g., routing layers) on the substrate. For instance, the conductive material can be deposited on the dielectric material to form the electronic circuits. In other examples, the conductive material can be a conductive sheet attached to the dielectric material. The conductive sheet can be etched to form the electronic circuit. Accordingly, the conductive material (layer) of the substrate can provide circuit routing, grounding, thermal energy distribution, electromagnetic shielding, or the like.

The substrate can include at least one contact, such as contact 113A-B or contact 123A-B. The contact can be located on the interface side, for example, the interface side 118 or the interface side 128. For instance, as show in the example of FIG. 1, the substrate can include a plurality of contacts, such as a plurality of contacts on the die side and the interface side. In an example, the interface side, such as the first interface side 118, can include a plurality of contacts (referred to herein as first contacts 113A). The die side can include a plurality of contacts, such as contacts 113B. In a further example, the interface side, such as the second interface side 128, can include a plurality of contacts (referred to herein as second contacts 123A). The die side 126 can include, a plurality of contacts such as contacts 123B. In some examples, the conductive layer can be configured as one or more contacts, such as first contacts 113A-B or second contacts 123A-B). For instance, a portion of the conductive layer can include a contact surface that is exposed for electrical communication with a mating contact.

As shown, the contact, such as contact 113B or 123B, can be electrically coupled to the die. For instance, the contact can be electrically coupled to another contact located on the die side, such as the first die side 116 or the second die side 126. The substrate can include a plurality of contacts located on the interface side or the die side. For example, the plurality of contacts can be arranged in a pattern, for instance, arranged for attaching a ball grid array (BGA). In a further example, the die, such as die 114 or the die 124, can be electrically coupled to the substrate by wire bonding, soldering, or other electrical coupling.

In various examples the plurality of contacts can be arranged to be interchangeable with other dies, electronic packages, or electronic devices. For instance, the plurality of contacts can be arranged in an industry standard format. In an example, one or more of the plurality of contacts can be located in a center portion of the substrate or within a location on the die side or the interface side corresponding to a periphery of the die. Locating one or more of the plurality of contacts within the center portion of the substrate or a location corresponding to the periphery of the die can to reduce the size of the electronic package. For instance, where the contacts can be placed in any region of the substrate, the size of the substrate can be reduced, for example, by increasing the density of contacts located on the substrate.

In some examples, the first electronic package 110 and the second electronic package 120 can have the same footprint. For instance, the length and width of the first electronic package 110 and the second electronic package 120 can be substantially the same size (e.g., within manufacturing tolerances). In further examples, the first electronic package 110 can have the same contact pattern as the second electronic package 120, can include the same contact assignment (e.g., corresponding to electrical function), or the like. In an example, the first electronic package 110 can be identical to the second electronic package 120. Accordingly, the die or the electronic package can be interchangeable. For instance, the first die 114 can be interchangeable with the second die 124, the first electronic package 110 can be interchangeable with the second electronic package 120, or the like. Accordingly, any combination of memory or logic packages or dies can be used.

As previously discussed, the first electronic package 110 can include an insulative covering, such as the first insulative covering 140. In an example, the insulative covering can be located on the first die side 116 and the first die 114 to increase the robustness of the first electronic package 110, such as the electrical coupling of the first die 114 to the first substrate 112. In a further example, the insulative covering 140 can electrically isolate the first die 114, die interconnects, or the contacts 113A from other electrical components of the integrated circuit assembly 100. In an example, the insulative covering 140 can cover the first die 114 and the first substrate 112. For instance, the insulative covering 140 can encapsulate the die 114 on the first substrate 112. The insulative covering, such as insulative covering 140, can be constructed of various materials including, but not limited to, liquid crystal polymer, nylon, epoxy, silica, or other mold compound materials.

In an example the collective substrate 130 can be electrically coupled to the first die 114 and the second die 124. The collective substrate 130 can be an interface for communicatively coupling (e.g., electrically coupling) the integrated circuit assembly 100 to the electronic device, such as a circuit board of the electronic device. In an example, the second electronic package 120 can be electrically coupled to the collective substrate 130 through the first substrate 112, as shown in the example of FIG. 1. In an example, the collective substrate 130 can include a first surface 132 and a second surface 134. The second surface 134 can be located on a side of the collective substrate 130 opposing the first surface 132.

The collective substrate 130 can be attached to the first electronic package 110. For instance, the collective substrate 130 can be attached to the face 142 of the first electronic package 110. As shown in the example of FIG. 1, the collective substrate 130 can be located on a side of the first electronic package 110 opposing the first package substrate 112, such as on the face 142. The collective substrate 130 can be attached to the first electronic package 110 with adhesive 138 (e.g., epoxy), die attach film, thermal bonding, ultra-sonic welding, or the like.

In various examples, the collective substrate 130 can include, but is not limited to, a construction as previously described with regard to the package substrate, such as the first package substrate 112 or the second package substrate 122. For instance, the collective substrate 130 can include one or more contacts (also referred to herein as third contacts) or routing layers. For instance, the first side 132 can include a contact 136A and the second side can include a contact 136B. In some examples, as previously described, the contact, such as contact 136A or 136B, can include a solder pad, wire bonding pad, LGA, BGA, or the like. In an example, the contact, such as contact 136A or the plurality of contacts of the collective substrate 130, can be electrically coupled to a plurality of corresponding contacts of the first package substrate 112. In an example, the plurality of contacts (e.g., first contacts 113A) of the first substrate 112 can be wire bonded to the plurality of contacts 136A, for instance, a wire 144 can be welded (e.g., wire bonded) to electrically couple the first electronic package 110 and the collective substrate 130, as shown in FIG. 1. The one or more contacts 136A can be electrically coupled to one or more contacts 136B. The contact 136B can be configured to be electrically coupled to the electronic device. For instance, the contact 136B can include a solder ball or be one of a plurality of contacts of an LGA or BGA. Accordingly, the first substrate 112 (e.g., the conductive layers or contacts of the first substrate 112) can be electrically coupled to the electronic device through the collective substrate 130.

The conductive interconnect 150 can communicatively couple the first electronic package 110 to the second electronic package 120. For instance, the conductive interconnect 150 can include, but is not limited to, a solder ball, solder preform, pin, spring contact, LGA, BGA, pin grid array (PGA), or other conductive interconnect. In various examples, the conductive interconnect 150 can be constructed of a material including gold, silver, tin, aluminum, steel, copper, solder, or other conductive material. In examples were the conductive interconnect 150 is a solder ball, the solder ball can include any spherical or non-spherical shape, or the solder ball can be in a melted or un-melted state (e.g., soldered or unsoldered). As shown in FIG. 1, the conductive interconnect 150 can be located from the first interface side 118 to the second interface side 128. For instance, the conductive interconnect 150 can electrically couple the first contact 113A to the second contact 123A. Accordingly, in an example, the conductive interconnect 150 can electrically couple the first die 114 to the second die 124 to communicate electrical signals between the first die 114 and the second die 124. Because of the orientation of the first electronic package 110 with respect to the second electronic package 120, the conductive interconnect 150 can have a dimension (e.g., length) along a longitudinal axis of the conductive interconnect 150 that is 10 µm, 500 µm, or any dimension therebetween. For instance, the first interface side 118 and the second interface side 128 can be located in close proximity because the first die 114 and the second die 124 are located on opposing sides of the first substrate 112 and the second substrate 122 respectively. Accordingly, the distance between the first interface 118 side and the second interface side 128 can be reduced. For instance, the dimension of the conductive interconnect 150 can be shorter than the thickness of the electronic package (e.g., the first electronic package 110) or the die, such as the first die 114 or a plurality of stacked dies within the first electronic package 110.

Figure 3:
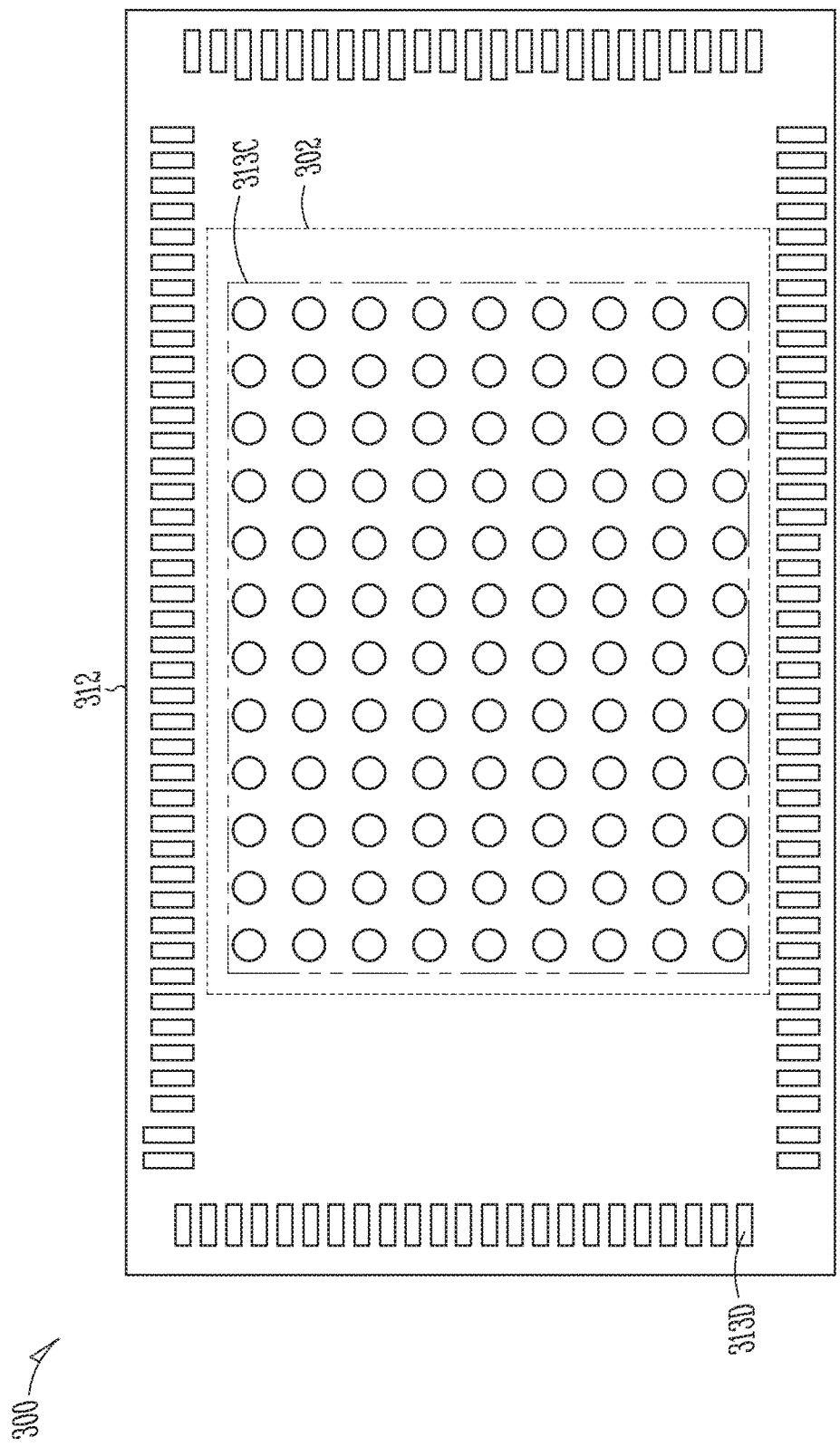
FIG. 3 illustrates an example of a top view of a substrate of a multi-package integrated circuit assembly, according to an embodiment.

In various examples, a plurality of the conductive interconnects 150 can be communicatively coupled between the first electronic package 110 and the second electronic package 120. For instance, the plurality of conductive interconnects 150 can be located from the first interface side 118 to the second interface side 128. In some examples, at least one conductive interconnect 150 can be located within a periphery of the first die 114 or the second die 124, such as a location on the first interface side 118 or the second interface side 128 corresponding to the perimeter of the respective die, as shown in the example of FIG. 3 and described herein. In an example, at least one of the conductive interconnects 150 can be located between the first die 114 and the second die 124, as shown in FIG. 1.

In the example of FIG. 1, the conductive interconnect 150 can be a solder ball. The solder ball can be attached to the contact, such as the first contact 113A. An insulative covering, such as an insulative covering 160 can be attached to the first electronic package 110. For instance, the insulative covering 160 can be disposed over the first electronic package 110. In other words, the insulative covering 160 can encapsulate the die 114 or the first side 132. In a further example, the insulative covering 160 can be disposed on the first electronic package 110 and the first side 132 of the collective substrate 130. In various examples, the insulative covering 160 can include various materials and functions as previously described with regard to insulative covering 140.

In an example, the insulative covering 160 can include a face, such as face 162. The face 162 can be located on an opposing side of the insulative covering 160 from the first surface 132. In the example of FIG. 1, the conductive interconnect (e.g., solder ball) can include a flat surface 152. In some examples, the flat surface 152 can be parallel with the face 162, such as coplanar with the face 162. The flat surface 152 can be formed by cutting or grinding the conductive interconnect 150. For instance, the face 162 and the conductive interconnect 150 can be cut or ground so the flat surface 152 and face 162 are coplanar. In other words, the conductive interconnect 150 is exposed through the insulative covering 160. Accordingly, the flat surface 152 or a plurality of flat surfaces 152 corresponding to the plurality of conductive interconnects 150 can provide an electrical contact interface for communicatively coupling the first electronic package 110 to the second electronic package 120. In an example, a second solder ball 170 or plurality of solder balls, such as a BGA can be electrically coupled (e.g., soldered) between the conductive interconnect 150 and the second contact 123A (e.g., on the second interface side 128).

In some examples, the insulative covering 160 can include an aperture. For instance, the conductive interconnect 150 can be located in the aperture. The aperture can include a first opening on the face 162 and extend to a second opening adjacent to the first interface side 118. For instance, the first contact 113A can be longitudinally aligned within the second opening, for example, aligned within a bore along a longitudinal direction of the aperture.

Figure 2:
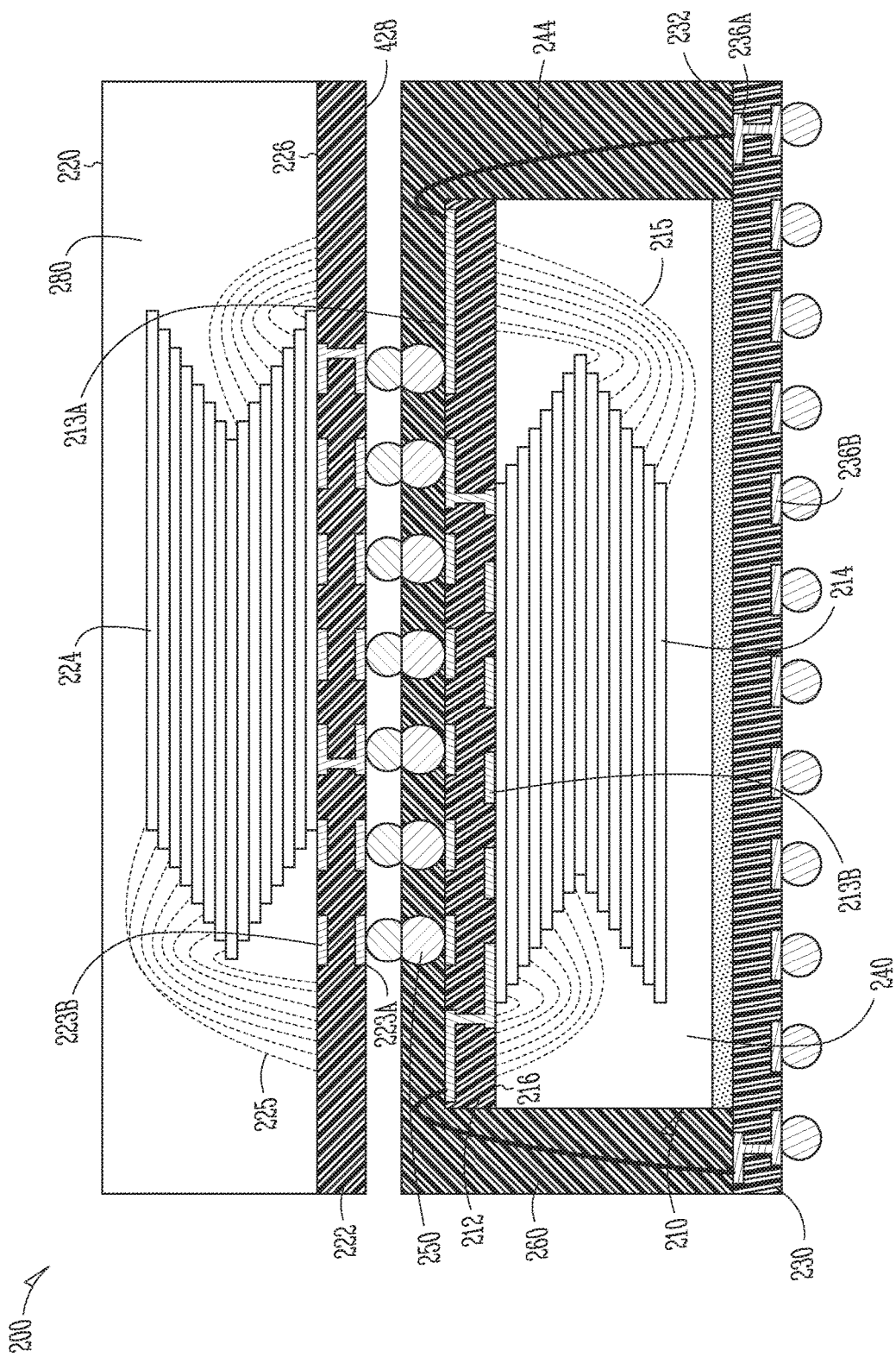
FIG. 2 depicts a three-dimensional multi-package integrated circuit assembly, according to an embodiment.

FIG. 2 is a perspective view of a three-dimensional multi-package integrated circuit assembly 200, according to an embodiment. The integrated circuit assembly 200 can include a first electronic package, such as first electronic package 210 and a second electronic package, such as a second electronic package 220. The first electronic package 210 or the second electronic package 220, can include a stacked die package. In the example, of FIG. 2, the first electronic package 210 and second electronic package 220 are shown in elevation and the first substrate 212, second substrate 222, collective substrate 230, conductive interconnect 250, and insulative covering 260 are shown in cross section.

The stacked die package can include a plurality of dies, such as a plurality of dies 114 or dies 124. The plurality of dies can be stacked on one another. For instance, an upper die can be attached to a top surface of a lower die and so on. In various examples, the plurality of dies can be attached to one another by solder, die attached film, adhesive, or the like. The plurality of dies can be located on the first die surface 216 or the second die surface 226 respectively. The stacked die can include any number of dies including, but not limited to, 2, 4, 16, 32 dies, or the other number of dies. In the example shown in FIG. 2, the alignment of the dies can be staggered to expose a portion of an upper face of each die. The exposed portion can include a contact pad for electrically coupling the die to the substrate, such as the corresponding first package substrate 212 or second package substrate 222. For instance, a wire, such as a wire 215 can be bonded between the substrate (e.g., first substrate 212) and the die (e.g., first die 214). A wire 225 can be electrically coupled between one or more of the plurality of second dies 224 and the second substrate 222. Accordingly, the dies can be electrically coupled to their respective substrates. By wire bonding the plurality of dies to the substrate, space on the plurality of dies can be saved by reducing the need for through silicon vias for electrically coupling the dies together or electrically coupling the plurality of dies to the substrate.

The second substrate 222 can be electrically coupled to the first substrate 212 by one or more conductive interconnects, such as a conductive interconnect 250. In an example, the conductive interconnect 250 can be electrically coupled to one or more of the plurality of first package dies 214 and one or more of the plurality of second package dies 224. For instance, a plurality of second contacts, such as second contact 223A, located on the second substrate 222 can be electrically coupled to a plurality of respective first contacts, such as contact 213A of the first substrate 212. In various examples, the first contact 213A can be electrically coupled to the first die 214 or the collective substrate 230. For instance, in some examples, the first contact 213A can be electrically coupled (e.g., wire bonded by wire 244) to contact 236A. Accordingly, the plurality of dies 224 of the second electronic package 220 can be electrically coupled to the collective substrate 230 through the first package substrate 212. For instance, the collective substrate 230 can be electrically coupled to the plurality of first package dies 214 and the plurality of second package dies 224 through the first package substrate 212.

The first electronic package 210 or the second electronic package 220 can include an insulative covering as shown in FIG. 2. For instance, the first electronic package 210 can include a first insulative covering 240. The first insulative covering 240 can encapsulate the plurality of first dies 214. In a further example, the second electronic package 220 can include a second insulative covering 280. The second insulative covering can encapsulate the plurality of second dies 224. An insulative covering, such as the third insulative covering 260 can be disposed over the first electronic package 210. In other words, the insulative, covering 260 can encapsulate the plurality of first dies 214 and a first side 232 of the collective substrate 230.

As shown in the example of FIG. 2, at least one of the plurality of conductive interconnects, such as conductive interconnect 250, can be located between at least one of the plurality of first dies 214 and at least one of the plurality of second dies 224. For instance, the dimension of the conductive interconnect 250 can be shorter than the thickness of the electronic package (e.g., the first electronic package 210) or the die, such as the plurality of first dies 214 (e.g., stacked dies). In an example, the conductive interconnect 250 can include a dimension along a longitudinal direction of the conductive interconnect 250 (e.g., between the first package 210 and the second package 220) that is 10 μm, 500 μm, or any dimension therebetween.

FIG. 3 illustrates an example of a top view of a substrate, such as substrate 312 of a multi-package integrated circuit assembly 300, according to an embodiment. In some examples, the first electronic package 110, the first electronic package 210, the second electronic package 120, or the second electronic package 220 can include the substrate 312. The substrate 312 can include a plurality of contacts, such as contacts 313C. In the example of FIG. 3, the plurality of contacts 3130 can be configured for attaching a BGA. For instance, the plurality of contacts 313C can be arranged in a pattern, such as a grid pattern. The plurality of contacts 313C can be electrically coupled to the conductive interconnect, such as the conductive interconnect 150 or the conductive interconnect 250 as previously described herein. For instance, the plurality of contacts 313C can be electrically coupled to the first electronic package (e.g., the electronic package 110 or the electronic package 210) or the second electronic package (e.g., the second electronic package 120 or the second electronic package 220) through one or conductive interconnects. The first electronic package or the second electronic package can include a plurality of contacts (die interconnects) having the same pattern and the plurality of contacts 313C. Accordingly, the contact pattern of the first electronic package or the second electronic package can be configured to be interchangeable with other electronic packages or electronic devices.

At least one of the plurality of contacts 313C can be located within a periphery 302 of one or more dies, such as the first die or the second die. In a further example, at least one of the plurality of conductive interconnects can be located within a periphery of the first die or the periphery of the second die. As described herein, the periphery 302 can include a location on the substrate 312 corresponding to the perimeter of the respective die. Where the electronic package includes a stacked die, such as the stacked die 214 or the stacked die 224, the periphery 302 can include a location on the substrate 312 corresponding to the perimeter of any one of the dies within the stacked die or a combined periphery of all of the dies within the stacked die. Accordingly, the conductive interconnect can be located between the first die and the second die.

The dimension of the conductive interconnect (e.g., along the longitudinal direction) can be reduced by locating the conductive interconnect between the first die and the second die. For instance, the conductive interconnect can include a dimension that is 10 µm, 500 µm, or any dimension therebetween. Locating the conductive interconnect between the first die and the second die can increase the number of conductive interconnects between the first electronic package and the second electronic package. For example, by positioning the first substrate and the second substrate between the first die and the second die, a region of the first substrate and the second substrate located between the first die and second die (e.g., center portion) can be used for electrically coupling the first electronic package to the second electronic package.

In a further example, warpage of the substrate 312 can cause variability in a dimension between the first substrate and the second substrate. The effects of warpage can be reduced in the center portion of the package. In an example, the center portion can be located in the center 50% of the length or width of the substrate 312. The variability of the dimension (e.g., related to warpage or tolerance) can be smaller in the center portion and can be greater towards the perimeter of the substrate. Locating the plurality of conductive interconnects in the center portion of the substrate can reduce the effects of substrate warpage on electrically coupling the conductive interconnect between the first electronic package and the second electronic package. Accordingly, the plurality of metallic plated holes, such as the first end of the metallic plated holes, can include a substantially planar alignment. For instance, the second ends, such as second end 154, can be aligned within a tolerance of less than 150 microns, such as 30 to 100 microns in a direction perpendicular to the substrate, such as substrate 112 or substrate 212.

In an example, locating the plurality of contacts, such as contacts 313C (and accordingly the conductive interconnects) in the center portion of the substrate 312 can reduce the size of the electronic package as more electrical connections can be located between the first die and the second die. Accordingly, space between the die and the perimeter of the substrate can be reduced corresponding to the reduced number of electrical connections located outside of the center portion of the substrate or outside of the periphery of the die. In a further example, because the first and second packages can include contacts located in the center portion of the electronic package (e.g., between the first die and the second die), the first electronic package and the second electronic package can be interchangeable. For instance, the first electronic package and the second electronic package can have the same size, the same contact pattern, or both.

In the example of FIG. 3, the substrate 312 can include a plurality of contacts 313D. For instance, the plurality of contacts 313D can be located around a perimeter of the substrate 312. In other words, the plurality of contacts 313D can be located between the perimeter of the substrate 312 and the plurality of contacts 313C. The plurality of contacts 313D can be electrically coupled to the plurality of contacts 313C or other contacts on the substrate, such as one or more contacts located on a die side or interface side of the substrate 312. In an example, the plurality of contacts 313D can be electrically coupled to the collective substrate, such as the collective substrate 130 or the collective substrate 230 as previously described. For instance, the plurality of contacts 313D can be wire bonded to a plurality of contacts, such as a plurality of contacts 136A located on the collective substrate 130. Accordingly, the first die and the first electronic package as well as the second die and the second electronic package can be electrically coupled to the collective substrate.

FIGS. 4A-E depict an example of a method 400, a process of making a multi-package integrated circuit assembly, such as a multi-package integrated circuit assembly including at least one conductive interconnect located between dies of the first and second respective electronic packages, such as the integrated circuit assembly 100 or the integrated circuit assembly 200 previously described in the examples herein and shown for instance in FIGS. 1-3. In describing the method 400, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 400 include, but are not limited to, the corresponding numbered elements provided herein. Other corresponding features described herein (both numbered and unnumbered) as well as their equivalents are also considered.

Figure 4A:
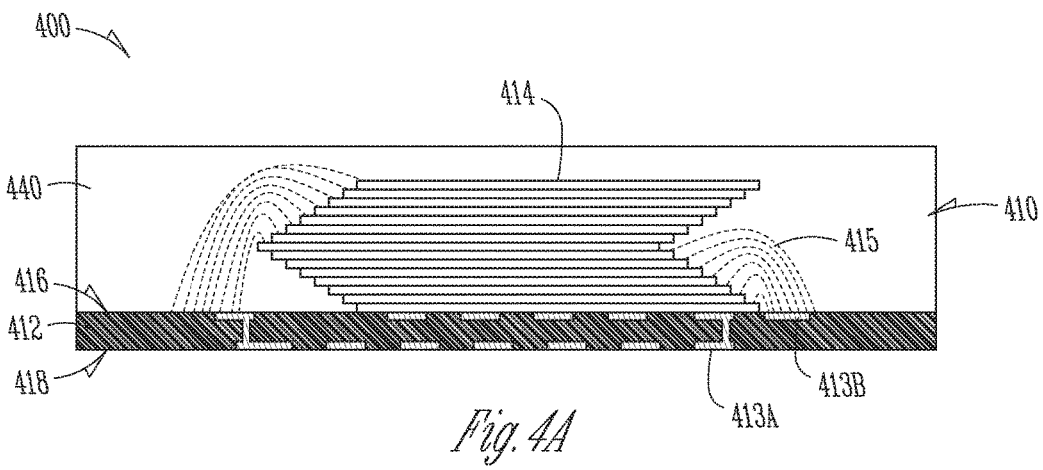
FIGS. 4A-E depict an example of a process of making an integrated circuit assembly, according to an embodiment.

At FIG. 4A, a first electronic package 410 can be provided. The first electronic package 410 can include a first package substrate 412 having a first die side 416 and a first interface side 418. The first die can be electrically coupled to the first die side 416. The first die side can include at least one contact 413B. In an example, the first die can be wire bonded to the first die side, such as wire bonded to the first contact 413B. The first interface side 418 can include a first contact 413A. The first contact 413A can be electrically coupled to the first die, such as through first contact 413B. In further examples, the first contact 413A can be one of a plurality of first contacts. For instance, the plurality of first contacts can be arranged for attaching a BOA on the first interface side 418. In a further example, at least one of the contacts can be formed in a center portion of the first interface side 418, such as within a region of the first substrate 412 corresponding to a periphery of the first die.

In the example of FIG. 4A, the first electronic package 410 includes a stacked die package 414 having a plurality of dies attached together. The plurality of dies of the stacked die package 414 can be wire bonded to the first package substrate 412. For instance, at least one die of the stacked die package 414 can be wire bonded to the first contact 413B (e.g., by wire 415) to electrically couple the first stacked die package 414 to the first contact 413A (e.g., located on the first interface side 418) through the first contact 413A. For instance, the first contact 413A can be electrically coupled to the first contact 413B through the first substrate 412, for example, by one or more routing layers or circuit interconnections of the first substrate 412. In further examples, the first die or first stacked die 414 can be soldered or otherwise electrically coupled to the first contact 213A. A first package insulative covering 440 can be applied on the first die or the first die side 416 to construct the first electronic package 410. For instance, the first die, such as the first stacked die 414 can be encapsulated with the first insulative covering 440 as previously described herein.

Figure 4B:
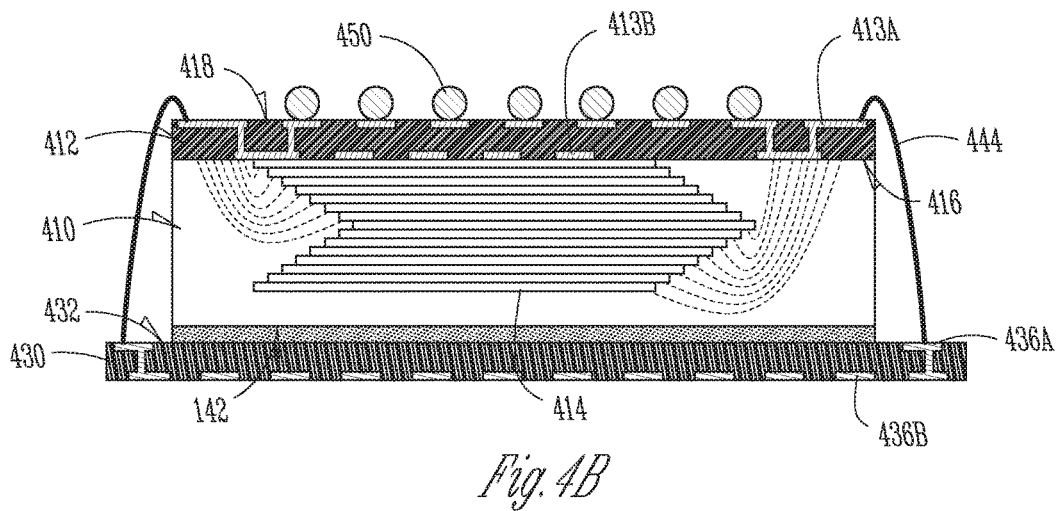

At FIG. 4B, a first surface 432 of a collective substrate 430 can be attached to the first electronic package 410. For instance, the first surface 432 of the collective substrate 430 can be attached to the first electronics package 410 with adhesive, die attached film, solder, or the like. In the example of FIG. 4B-E, the collective substrate 430 can be attached for the first electronic package 410 by an adhesive 438. In an example, the collective substrate 430 can be attached to a face 142 of the first electronic package 410 opposing the first package substrate 412. The first stacked die 414 can be located between the first surface 432 and the first die side 416.

The first package substrate 412 can be electrically coupled to the collective substrate 430. For instance, the first contact 413A can be electrically coupled to the contact 436A. In the example, of FIG. 4B, the first contact 413A is wire bonded to the contact 436A, such as by a wire 444. In a further example, a plurality of first contacts (e.g., contacts 413A) of the first substrate 412 can be electrically coupled to a plurality of corresponding contacts (e.g., 436A-B) of the collective substrate 430, for instance, by wire bonding.

A conductive interconnect, such as conductive interconnect 450, can be electrically coupled to the first contact 413A. For instance, in the example of FIG. 4B, a plurality of conductive interconnects can be electrically coupled to a plurality of respective first contacts located on the first interface side 418, such as the first contact 413A. In an example, the conductive interconnect can be solder, such as a solder ball as previously described herein. In a further example, the conductive interconnect 450 can one of a plurality of conductive interconnects of a BGA attached to the first substrate 412.

Figure 4C:
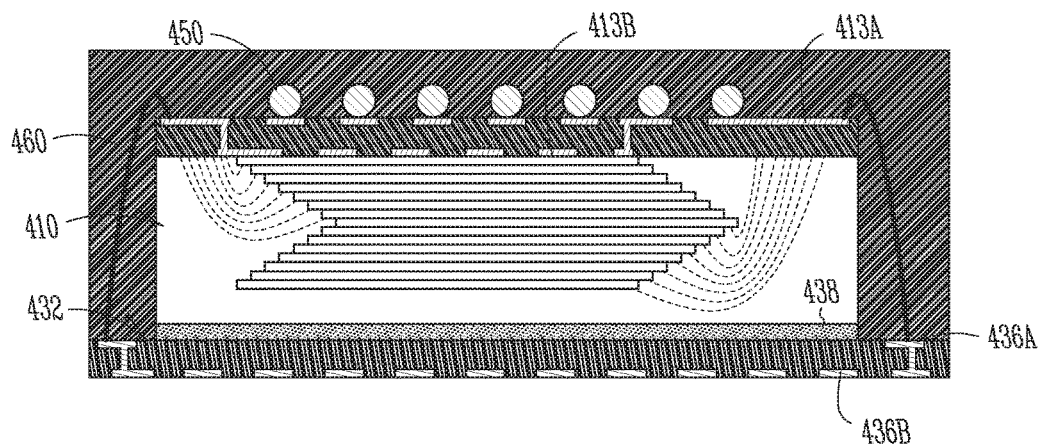

At FIG. 4C, an insulative covering, such as insulative covering 460 can be applied to the first electronic package 410. For instance, the insulative covering 460 can be applied to cover the first surface 432 and cover the first electronic package 410. In other words, the insulative covering 460 can encapsulate the first electronic package 410 on the first surface 432. The conductive interconnect 450 (e.g., solder ball) can be at least partially located within the insulative covering 460.

Figure 4D:
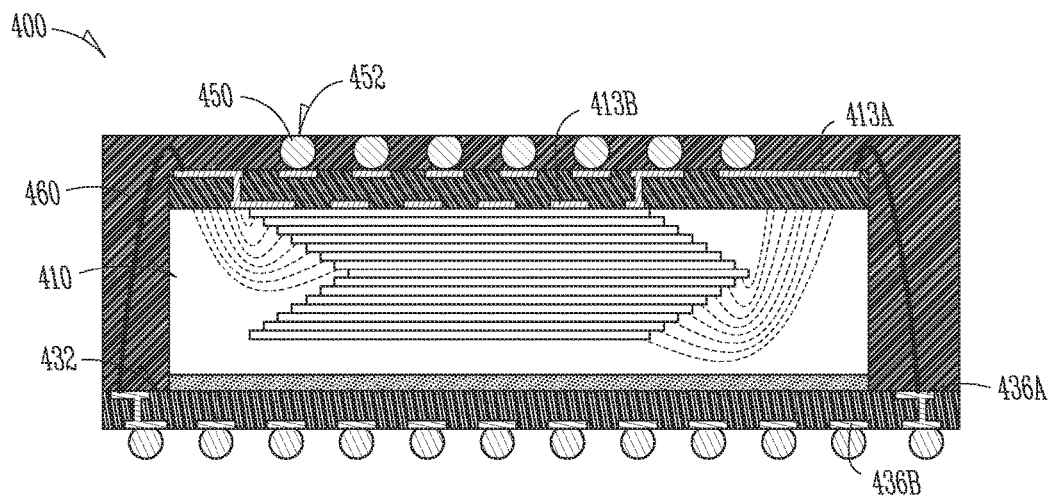

At FIG. 4D, a portion of the insulative covering 460 and a portion of the conductive interconnect 450 (e.g., solder ball) can be removed to form a package connection interface. In various examples, the portion of the conductive interconnect 450 and the portion of the insulative covering 460 can be removed by a process including, but not limited to, machining, cutting, grinding, laser cutting, water cutting, chemical etching, or other removal process. Accordingly, the conductive interconnect 450 can include a flat surface 452. For instance, the flat surface can be a result of removing the portion of the insulative covering 460 and the conductive interconnect 450. In a further example, the conductive interconnect 450 can be filled with a conductive material. For instance, the conductive interconnect 450 can include a cavity therein. The cavity can be filled with a conductive or a non-conductive filler, such as solder, metallic plating, a polymer (e.g., epoxy), or the like.

Figure 4E:
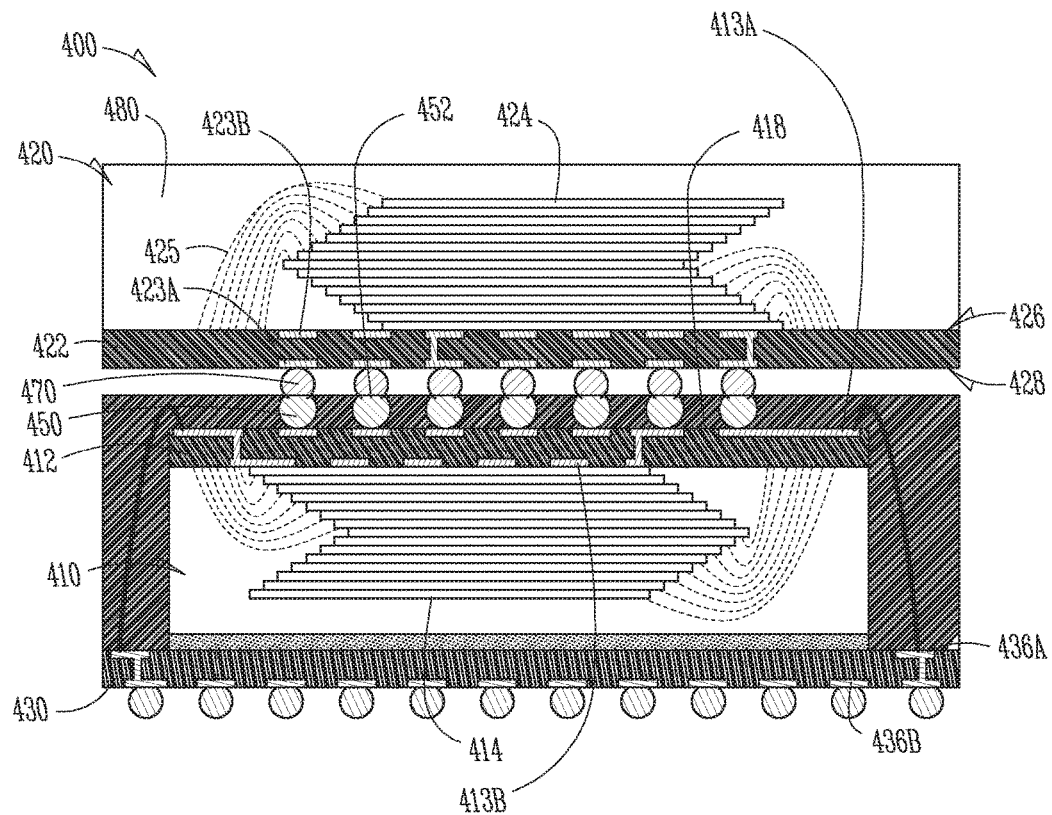

At FIG. 4E, the conductive interconnect 450 can be electrically coupled to a second electronic package 420. The second electronic package 420 can include a second package substrate 422 and a second die. The second package substrate 422 can include a second die side 426 and a second interface side 428. A second contact 243A can be located on the second interface side 428 and is electrically coupled to the second die. The conductive interconnect 450 can be electrically coupled to the second contact 423A. In some examples, a second contact 423A is one of a plurality of second contacts arranged to attach a BGA on the second interface side 428. For instance, the second electronic package 420 can be configured to have a contact pattern that is the same as the contact pattern of the first electronic package. In some examples, the plurality of contacts, such as contact 423A can be formed in a location in a center portion of the second interface side 428. For instance, one or more contacts 423A can be located within a periphery of the second die (e.g., similar to the example of FIG. 3). The center portion can be located in the center 50% of the length or width of the second substrate 422. In an example, the second electronic package 420 can be the same size as the first electronic package 410. For instance, the first electronic package 410 and the second electronic package 420 can be configured to be interchangeable. In the example of FIGS. 4A-E, the second electronic package 420 can be provided as (or, e.g., constructed to be) a stacked die package having a plurality of stacked dies 414 attached together. In some examples, the second die or the plurality of second dies 414 can be wire bonded to the second die side 426, such as by a wire 425. A second package insulative covering 280 can be applied on the second die (or the plurality of second stacked dies 414) or the second die side 426 to construct the second electronic package 420.

Coupling the conductive interconnect, such as the plurality of conductive interconnects 450, to the second electronic package 420 can include forming one or more of the conductive interconnects from the first interface side 418 to the second interface side 428. For instance, the conductive interconnect 450 can be electrically coupled between the first electronic package 410 and the second electronic package 420 at a location between the first die (e.g., first stacked die 414) and the second die (e.g., second stacked die 424). In an example, at least one of the conductive interconnects 450 can be located within a periphery of the first die, such as the first stacked die 414. For instance, the conductive interconnect 450 can be electrically coupled to the second substrate 422 at a location on the second substrate 422 (e.g., a location of a contact 423A) corresponding to the periphery of the second die or second stacked die 424. In a further example, the conductive interconnect 450 can be formed or configured to include a dimension along a longitudinal axis of the conductive interconnect 450 that is 10 µm, 500 µm, or any dimension therebetween.

In the example shown in FIG. 4E, electrically coupling the conductive interconnect 450 to a second electronic package 420 includes attaching a second solder ball 470 to a contact 423A located on the second interface side 428 and soldering the second electronic package 420 to the package connection interface (e.g., the conductive interconnect 450). The first contact 413A can be one of a plurality of first contacts and the second contact 423A can be one of a plurality of second contacts arranged for coupling a BGA on at least one of the first interface side 418 or the second interface side 428. For instance, a BGA can be disposed on the first contact 413A. The BGA can include the conductive interconnect 450, such as a plurality of conductive interconnects. A second BGA can include the solder ball 470. The second BGA can be disposed on the flat surface 452 of the conductive interconnect 450 on the second contact 423A, such as on a plurality of second contacts. Accordingly, the first electronic package 410 can be electrically coupled to the second electronic package 420 by the conductive interconnect 450.

The first die (e.g., stacked die 414) and the second die (e.g., stacked die 424) can be electrically coupled to the collective substrate 430, such as electrically coupled to one or more contacts 436A or electrical contacts 436B. For instance, one or more of the plurality of contacts, such as contact 413A or contact 423A can be electrically coupled to one or more corresponding contacts (e.g., 136A-B) of the collective substrate 430 through the first package substrate 412. In an example, the first electronic package 410 can be electrically coupled to the second electronic package 420 to provide electrical communication between the first electronic package 410 and the second electronic package 420. Where the first electronic package 410 or the second electronic package 420 includes a stacked die, such as the stacked die 414 or the stacked die 424 as shown in the example of FIG. 4E, the plurality of dies of the stacked die 414 or the stacked die 424 can be electrically coupled to the collective substrate 430 through the first substrate 412. In a further example, a BGA formed on the collective substrate 230, such as on contact 436B to electrically couple the first electronic package 410 and the second electronic package 420 to the electronic device.

Figure 5:
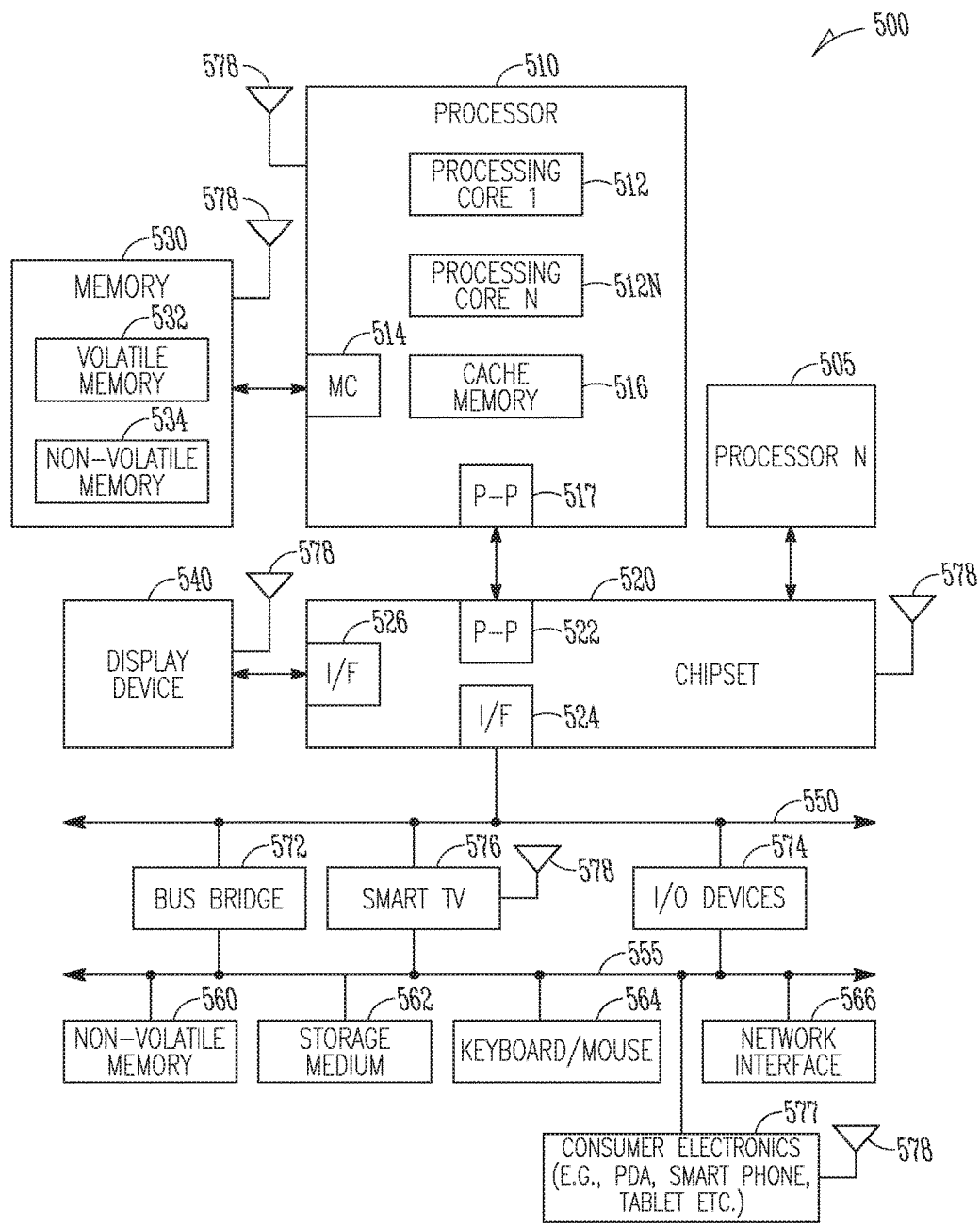
FIG. 5 illustrates a system level diagram in accordance with some embodiments of the invention.

FIG. 5 illustrates a system level diagram, according to one embodiment of the invention. For instance, FIG. 5 depicts an example of an electronic device (e.g., system) including a multi-package integrated circuit assembly, such as a integrated circuit assembly including a first electronic package electrically coupled to a second electronic package by a conductive interconnect located between dies of the first and second respective electronic packages, as described in the present disclosure. FIG. 5 is included to show an example of a higher level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. For instance, the processing core 512 or processing core 512N can include the first die 414 or the second die 124, as previously described herein. In one embodiment, system 500 includes multiple processors including 510 and 505, where processor 505 has logic similar or identical to the logic of processor 510. In an example, the processor 510 can include the integrated circuit assembly 100. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. In an example, the memory 530 can include the first electronic package 110 or the second electronic package 120. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (Pail), read-only memory (ROM), electrically erasable programmable read-only memory (EEPROM), or any other type of non-volatile memory device.

Memory 530 stores information and instructions to be executed by processor 510. In one embodiment memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. In an example, the chipset 520 can include the integrated circuit assembly 100. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention. processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520, via interface 524, couples with a non-volatile memory 560, a mass storage device(s) 562, a keyboard/mouse 564, a network interface 566, smart TV 576, consumer electronics 577, etc. In various examples, the integrated circuit assembly 100 can be included in at least one or more of the display 540, smart TV 576, I/O devices 574, non-volatile memory 560, storage medium 562, network interface 566, processor 505, or consumer electronics device 577.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate dies, electronic packages, or integrated circuit assemblies. For example, although cache memory 516 is depicted as a separate block within processor 510, cache memory 516 (or selected aspects of 516) can be incorporated into processor core 512.

VARIOUS NOTES & EXAMPLES

Each of these non-limiting examples may stand on its own, or may be combined in various permutations or combinations with one or more of the other examples. To better illustrate the method and apparatuses disclosed herein, a non-limiting list of embodiments is provided here:

Example 1 is a multi-package integrated circuit assembly comprising: a first electronic package including a first package substrate having a first die side and a first interface side, a first die electrically coupled to the first die side of the first package substrate; a second electronic package including a second package substrate having a second die side and a second interface side, a second die electrically coupled to the second die side of the second package substrate; a conductive interconnect electrically coupling the first package substrate and the second package substrate, wherein the conductive interconnect is located from the interface side of the first package substrate to the interface side of the second package substrate; and a collective substrate attached to the first electronic package, wherein the collective substrate is located on a face of the first electronic package opposing the first package substrate, and the collective substrate is electrically coupled to the first die and the second die through the first package substrate.

In Example 2, the subject matter of Example 1 optionally includes wherein at least one of the first package and the second package includes a plurality of contacts arranged for a ball grid array (BGA).

In Example 3, the subject matter of any one or more of Examples 1-2 optionally include wherein at least one of the first die and the second die is a stacked die package having a plurality of dies attached together.

In Example 4, the subject matter of Example 3 optionally includes wherein the plurality of dies of the second electronic package are wire bonded to the second package substrate.

In Example 5, the subject matter of any one or more of Examples 3-4 optionally include wherein the plurality of dies of the second electronic package are electrically coupled to the collective substrate through the first package substrate.

In Example 6, the subject matter of any one or more of Examples 1-5 optionally include wherein the first electronic package and the second electronic package include a plurality of contacts located in a center portion of the first interface side and the second interface side respectively.

In Example 7, the subject matter of any one or more of Examples 1-6 optionally include wherein the first electronic package and the second electronic package have the same footprint.

In Example 8, the subject matter of any one or more of Examples 1-7 optionally include wherein a contact pattern of the first electronic package and the second electronic package are identical.

In Example 9, the subject matter of any one or more of Examples 1-8 optionally include wherein the first die is wire boded to the first die side.

In Example 10, the subject matter of any one or more of Examples 1-9 optionally include wherein a plurality of contacts of the first package substrate are electrically coupled to a plurality of corresponding contacts of the collective substrate.

In Example 11, the subject matter of any one or more of Examples 1-10 optionally include a first insulative covering over the first die and the first die side and a second insulative covering over the second die and the second die side.

In Example 12, the subject matter of any one or more of Examples 1-11 optionally include a third insulative covering over the first package.

In Example 13, the subject matter of any one or more of Examples 1-12 optionally include wherein the conductive interconnect is located within a periphery of the first die.

In Example 14, the subject matter of any one or more of Examples 1-13 optionally include a plurality of conductive interconnects located from the interface side of the first substrate to the interface side of the second substrate, wherein the plurality of conductive interconnects are located within a periphery of the first die.

In Example 15, the subject matter of any one or more of Examples 1-14 optionally include wherein the conductive interconnect is located between the first die and the second die.

In Example 16, the subject matter of any one or more of Examples 1-15 optionally include wherein the conductive interconnect is located within a periphery of the second die.

In Example 17, the subject matter of any one or more of Examples 1-16 optionally include wherein the conductive interconnect includes a dimension along a longitudinal axis of the conductive interconnect that is 10 μm, 500 μm, or any dimension therebetween.

In Example 18, the subject matter of any one or more of Examples 1-17 optionally include wherein the collective substrate is electrically coupled to the first package substrate by wire bonding.

In Example 19, the subject matter of Example 18 optionally includes wherein the collective substrate includes a BGA.

In Example 20, the subject matter of any one or more of Examples 1-19 optionally include wherein the conductive interconnect is electrically coupled to the first die and the second die.

In Example 21, the subject matter of any one or more of Examples 1-20 optionally include wherein the conductive interconnect is a solder ball, the solder ball including a flat surface.

In Example 22, the subject matter of any one or more of Examples 1-21 optionally include an insulative covering over the first package and a first side of the collective substrate, wherein the conductive interconnect is a solder ball, and a face of the insulative covering first is coplanar with a flat surface of the solder ball.

In Example 23, the subject matter of any one or more of Examples 1-22 optionally include a second solder ball located between the first solder ball and the second interface side.

Example 24 is a method of electrically coupling a first electronic package to second electronic package of a multi-package integrated circuit assembly, the method comprising: attaching a first surface of a collective substrate to a first electronic package, the first electronic package including a first package substrate having a first die side and a first interface side, the first die located between the first surface and the first die side, wherein a first die is electrically coupled to the first die side, and the first interface side includes a first contact electrically coupled to the first die; electrically coupling the first package substrate to the collective substrate; electrically coupling a conductive interconnect to the first contact; applying a insulative covering to the first electronic package, wherein the conductive interconnect is at least partially located within the insulative covering; electrically coupling the conductive interconnect to a second electronic package, the second electronic package including a second package substrate and a second die, the second package substrate including a second die side and a second interface side, a second contact is located on the second interface side and is electrically coupled to the second die, wherein the conductive interconnect is electrically coupled to the second contact.

In Example 25, the subject matter of Example 24 optionally includes wherein attaching the first surface of the collective substrate to the first electronic package includes attaching a first electronic package including a stacked die package having a plurality of dies attached together.

In Example 26, the subject matter of Example 25 optionally includes wire bonding the plurality of dies to the first package substrate.

In Example 27, the subject matter of any one or more of Examples 24-26 optionally include forming a plurality of contacts located in a center portion of at least one of the first interface side and the second interface side.

In Example 28, the subject matter of any one or more of Examples 24-27 optionally include wire bonding at least one of the first die and the second die to one of the first die side and the second die side respectively.

In Example 29, the subject matter of any one or more of Examples 24-28 optionally include wherein attaching the first surface of the collective substrate to the first electronic package includes electrically coupling the first contact to the first die through the first package substrate.

In Example 30, the subject matter of any one or more of Examples 24-29 optionally include applying a first package insulative covering on the first die and the first die side to construct the first electronic package.

In Example 31, the subject matter of any one or more of Examples 24-30 optionally include applying a second package insulative covering on the second die and the second die side to construct the second electronic package.

In Example 32, the subject matter of any one or more of Examples 24-31 optionally include forming a ball grid array (BGA) on the collective substrate.

In Example 33, the subject matter of any one or more of Examples 24-32 optionally include wherein attaching the first surface of the collective substrate to the first electronic package includes attaching the collective substrate to a face of the first electronic package opposing the first package substrate.

In Example 34, the subject matter of any one or more of Examples 24-33 optionally include wherein the first package substrate is wire bonded to the collective substrate.

In Example 35, the subject matter of any one or more of Examples 24-34 optionally include wherein electrically coupling the first package substrate to the collective substrate includes electrically coupling a plurality of first contacts of the first package substrate to a plurality of corresponding contacts of the collective substrate.

In Example 36, the subject matter of any one or more of Examples 24-35 optionally include wherein attaching the first surface of the collective substrate to the first electronics package includes bonding the first surface of the collective substrate to the first electronics package with adhesive.

In Example 37, the subject matter of any one or more of Examples 24-36 optionally include forming a plurality of conductive interconnects located from the first interface side to the second interface side, wherein the conductive interconnects are located within a periphery of the first die.

In Example 38, the subject matter of any one or more of Examples 24-37 optionally include wherein electrically coupling the conductive interconnect includes electrically coupling the conductive interconnect in a location between the first die and the second die.

In Example 39, the subject matter of any one or more of Examples 24-38 optionally include wherein electrically coupling the conductive interconnect includes electrically coupling the conductive interconnect within a periphery of the second die.

In Example 40, the subject matter of any one or more of Examples 24-39 optionally include wherein electrically coupling the conductive interconnect includes electrically coupling the conductive interconnect having a dimension along a longitudinal axis of the conductive interconnect that is 10 µm, 500 µm, or any dimension therebetween.

In Example 41, the subject matter of any one or more of Examples 24-40 optionally include wherein electrically coupling the conductive interconnect includes filling the conductive interconnect with a conductive material.

In Example 42, the subject matter of any one or more of Examples 24-41 optionally include wherein electrically coupling the conductive interconnect to the second electronic package includes electrically coupling a plurality of contacts of the second package substrate to a plurality of corresponding contacts of the collective substrate through the first package substrate.

In Example 43, the subject matter of any one or more of Examples 24-42 optionally include wherein electrically coupling the conductive interconnect to the second electronic package includes electrically coupling the first electronic package to the second electronic package for electrical communication between the first electronic package and the second electronic package.

In Example 44, the subject matter of any one or more of Examples 24-43 optionally include electrically coupling the first die and the second die to the collective substrate.

In Example 45, the subject matter of any one or more of Examples 24-44 optionally include wherein electrically coupling the conductive interconnect to the second electronic package includes electrically coupling a second electronic package that is the same size as the first electronic package.

In Example 46, the subject matter of any one or more of Examples 24-45 optionally include wherein electrically coupling the conductive interconnect to the second electronic package includes electrically coupling a second electronic package having a contact pattern that is identical to a contact pattern of the first electronic package.

In Example 47, the subject matter of any one or more of Examples 24-46 optionally include wherein electrically coupling the conductive interconnect to the second electronic package includes electrically coupling a second electronic package including a stacked die package having a plurality of dies attached together.

In Example 48, the subject matter of Example 47 optionally includes electrically coupling the plurality of dies of the second electronic package to the collective substrate through the first package substrate.

In Example 49, the subject matter of any one or more of Examples 24-48 optionally include wherein the conductive interconnect is solder.

In Example 50, the subject matter of Example 49 optionally includes wherein the conductive interconnect is a solder ball.

In Example 51, the subject matter of any one or more of Examples 24-50 optionally include applying an insulative covering to the first electronic package, wherein the conductive interconnect is a solder ball at least partially located within the insulative covering.

In Example 52, the subject matter of Example 51 optionally includes removing a portion of the insulative covering and a portion of the solder ball to form a package connection interface on the first electronic package.

In Example 53, the subject matter of Example 52 optionally includes wherein electrically coupling the conductive interconnect to a second electronic package includes attaching a second solder ball to the second interface side and soldering the second electronic package to the package connection interface.

In Example 54, the subject matter of Example 53 optionally includes wherein the first contact is one of a plurality of first contacts and the second contact is one of a plurality of second contacts arranged as a ball grid array (BGA) on at least one of the first interface side and the second interface side.

Example 55 is a three-dimensional multi-package integrated circuit assembly comprising: a first electronic package including a first package substrate having a first die side and a first interface side, a plurality of first package dies electrically coupled to the first die side of the first package substrate; a second electronic package including a second package substrate having a second die side and a second interface side, a plurality of second package dies electrically coupled to the second die side of the second package substrate; a conductive interconnect electrically coupling the first package substrate and the second package substrate, wherein the conductive interconnect is located from the interface side of the first package substrate to the interface side of the second package substrate; and a collective substrate attached to the first electronic package, wherein the collective substrate is located on a face of the first electronic package opposing the first package substrate, and the collective substrate is electrically coupled to the first package substrate and the second package substrate, and the second package substrate is electrically coupled to the collective substrate through the first package substrate.

In Example 56, the subject matter of Example 55 optionally includes wherein at least one of the first package and the second package includes a plurality of contacts arranged for a ball grid array (BGA).

In Example 57, the subject matter of any one or more of Examples 55-56 optionally include wherein the plurality of second package dies are wire bonded to the second package substrate.

In Example 58, the subject matter of any one or more of Examples 55-57 optionally include wherein the plurality of second package dies are electrically coupled to the collective substrate through the first package substrate.

In Example 59, the subject matter of any one or more of Examples 55-58 optionally include wherein the first electronic package and the second electronic package include a plurality of contacts located in a center portion of the first interface side and the second interface side respectively.

In Example 60, the subject matter of any one or more of Examples 55-59 optionally include wherein the first electronic package and the second electronic package have the same footprint.

In Example 61, the subject matter of any one or more of Examples 55-60 optionally include wherein a contact pattern of the first electronic package and the second electronic package are identical.

In Example 62, the subject matter of any one or more of Examples 55-61 optionally include wherein the plurality of first package dies are wire boded to the first die side.

In Example 63, the subject matter of any one or more of Examples 55-62 optionally include wherein a plurality of contacts of the first package substrate are electrically coupled to a plurality of corresponding contacts of the collective substrate.

In Example 64, the subject matter of any one or more of Examples 55-63 optionally include a first insulative covering over the plurality of first package dies and the first die side and a second insulative covering over the plurality of first package dies and the second die side.

In Example 65, the subject matter of any one or more of Examples 55-64 optionally include a third insulative covering over the first package and a first side of the collective substrate.

In Example 66, the subject matter of any one or more of Examples 55-65 optionally include wherein the conductive interconnect is located within a periphery of the plurality of first package dies.

In Example 67, the subject matter of any one or more of Examples 55-66 optionally include a plurality of conductive interconnects located from the interface side of the first substrate to the interface side of the second substrate, wherein the plurality of conductive interconnects are located within a periphery of the plurality of first package dies.

In Example 68, the subject matter of any one or more of Examples 55-67 optionally include wherein the conductive interconnect is located between the plurality of first package dies and the plurality of second package dies.

In Example 69, the subject matter of any one or more of Examples 55-68 optionally include wherein the conductive interconnect is located within a periphery of the plurality of second package dies.

In Example 70, the subject matter of any one or more of Examples 55-69 optionally include wherein the conductive interconnect includes a dimension along a longitudinal axis of the conductive interconnect that is 10 μm, 500 μm, or any dimension therebetween.

In Example 71, the subject matter of any one or more of Examples 55-70 optionally include wherein the collective substrate is electrically coupled to the first package substrate by wire bonding.

In Example 72, the subject matter of Example 71 optionally includes wherein the collective substrate includes a BGA.

In Example 73, the subject matter of any one or more of Examples 55-72 optionally include wherein the conductive interconnect is electrically coupled to the plurality of first package dies and the plurality of second package dies.

In Example 74, the subject matter of any one or more of Examples 55-73 optionally include wherein the collective substrate is electrically coupled to the plurality of first package dies and the plurality of second package dies through the first package substrate.

In Example 75, the subject matter of any one or more of Examples 55-74 optionally include wherein the conductive interconnect is solder.

In Example 76, the subject matter of any one or more of Examples 55-75 optionally include wherein the conductive interconnect is a solder ball, the solder ball including a flat surface.

In Example 77, the subject matter of any one or more of Examples 55-76 optionally include an insulative covering over the first package and a first side of the collective substrate, wherein the conductive interconnect is a solder ball, and a face of the insulative covering is coplanar with a flat surface of the solder ball.

In Example 78, the subject matter of Example 77 optionally includes a second solder ball located between the first solder ball and the second interface side.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A multi-package integrated circuit assembly comprising:
   a first electronic package including a first package substrate having a first die side and a first interface side;
   first plurality of dies electrically coupled to the first die side of the first package substrate, the first plurality of dies staggered to expose a portion of a contact pad on a face of each die facing away from the first die side;
   respective first plurality of wire bonds electrically coupling respective contact pads and the first die side;
   a second electronic package including a second package substrate having a second die side and a second interface side;
   a second die electrically coupled to the second die side of the second package substrate;
   a conductive interconnect electrically coupling the first package substrate and the second package substrate, wherein the conductive interconnect is located from the interface side of the first package substrate to the interface side of the second package substrate;

a collective substrate attached to the first electronic package, wherein the collective substrate is located on a face of the first electronic package opposing the first package substrate, and the collective substrate is electrically coupled to the first die and the second die through the first package substrate; and a second plurality of wire bonds electrically coupling the first interface side and the collective substrate.

2. The integrated circuit assembly of claim 1, wherein the second die is a stacked die package having a plurality of second dies attached together and staggered to expose a portion of a contact pad on a face of each die facing away from the second die side.

3. The integrated circuit assembly of claim 2, wherein the plurality of second dies of the second electronic package are electrically coupled to the collective substrate through the first package substrate.

4. The integrated circuit assembly of claim 1, wherein the conductive interconnect is located within a periphery of the first plurality of dies.

5. The integrated circuit assembly of claim 1, further comprising a plurality of conductive interconnects located from the interface side of the first package substrate to the interface side of the second package substrate, wherein the plurality of conductive interconnects are located within a periphery of the first plurality of dies.

6. The integrated circuit assembly of claim 1, wherein the conductive interconnect is located between the first plurality of dies and the second die.

7. The integrated circuit assembly of claim 1, wherein the conductive interconnect includes a dimension along a longitudinal axis of the conductive interconnect that is 10 µm, 500 µm, or any dimension therebetween.

8. The integrated circuit assembly of claim 1, wherein the conductive interconnect is a solder ball, the solder ball including a flat surface.

9. The integrated circuit assembly of claim 1, further comprising an insulative covering over the first package and a first side of the collective substrate, wherein the conductive interconnect is a solder ball, and a face of the insulative covering is coplanar with a flat surface of the solder ball.

10. A three-dimensional multi-package integrated circuit assembly comprising:

a first electronic package including a first package substrate having a first die side and a first interface side, a plurality of first package dies electrically coupled to the first die side of the first package substrate, the plurality of first package dies staggered to expose a portion of a contact pad on a face of each die facing away from the first die side;

respective first plurality of wire bonds electrically coupling respective contact pads and the first die side;

a second electronic package including a second package substrate having a second die side and a second interface side, a plurality of second package dies electrically coupled to the second die side of the second package substrate, the plurality of second package dies staggered to expose a portion of a contact pad on a face of each die facing away from the second die side;

a conductive interconnect electrically coupling the first package substrate and the second package substrate, wherein the conductive interconnect is located from the interface side of the first package substrate to the interface side of the second package substrate;

a collective substrate attached to the first electronic package, wherein the collective substrate is located on a face of the first electronic package opposing the first package substrate, and the collective substrate is electrically coupled to the first package substrate and the second package substrate, and the second package substrate is electrically coupled to the collective substrate through the first package substrate; and a second plurality of wire bonds electrically coupling the first interface side and the collective substrate.

11. The integrated circuit assembly of claim 10, wherein the plurality of second package dies are electrically coupled to the collective substrate through the first package substrate.

12. The integrated circuit assembly of claim 10, wherein the conductive interconnect is located between the plurality of first package dies and the plurality of second package dies.

13. The integrated circuit assembly of claim 10, wherein the conductive interconnect includes a dimension along a longitudinal axis of the conductive interconnect that is 10 µm, 500 µm, or any dimension therebetween.

14. The integrated circuit assembly of claim 10, further comprising an insulative covering over the first package and a first side of the collective substrate, wherein the conductive interconnect is a solder ball, and a face of the insulative covering is coplanar with a flat surface of the solder ball.

* * * * *